United States Patent [19]

Martin

[11] Patent Number: 4,575,854
[45] Date of Patent: Mar. 11, 1986

[54] UNCOOLED YAG LASER

[75] Inventor: Danny W. Martin, St. Charles, Mo.

[73] Assignee: McDonnell Douglas Corporation, Long Beach, Calif.

[21] Appl. No.: 541,871

[22] Filed: Oct. 14, 1983

[51] Int. Cl.[4] .............................................. H01S 3/094
[52] U.S. Cl. ........................................ 372/75; 372/36
[58] Field of Search ........................ 372/75, 70, 72, 36

[56] References Cited

U.S. PATENT DOCUMENTS

| | | | |
|---|---|---|---|
| 3,624,545 | 11/1971 | Ross | 372/75 |
| 3,683,296 | 8/1972 | Scalise | 372/36 |
| 3,711,789 | 1/1973 | Dierschke | 372/75 |
| 4,439,861 | 3/1984 | Bradford | 372/75 |

OTHER PUBLICATIONS

*Linear Array Configurations and Applications of the Double-Sided Heat Sink Diode*, Louis B. Allen, Jr., Robert R. Rice, Herbert G. Koenig, Danny D. Meyer, McDonnell Douglas Astronautics Company, SPIE, vol. 247, Advances in Laser Engineering and Applications (1980).
*Double-Sided Heat Sinking for the Injection Laser Diode*, Louis B. Allen, Jr., Herbert G. Koenig, Jr., McDonnell Douglas Astronautics Company; SPIE vol. 247, Advances in Laser Engineering and Applications (1980).
*100 mW Laser Diode Pumped Nd:YAG Laser*, R. J. Smith, R. R. Rice, L. B. Allen, Jr., McDonnell Douglas Astronautics Company, SPIE vol. 247 Advances in Laser Engineering and Applications (1980).
*RF Modulation of a High Power GaAlAs Laser Diode Array* Charles R. Chubb, Louis B. Allen, Victor H. Nettle, Robert R. Rice, McDonnell Douglas Astronautics Company, SPIE, vol. 247 Advances in Laser Engineering and Applications (1980).

Primary Examiner—James W. Davie
Attorney, Agent, or Firm—Paul T. Loef; George W. Finch; Donald L. Royer

[57] ABSTRACT

An Nd:YAG laser pumped by an array of diode laser bars. The diode laser bars are driven by high frequency pulsed DC and switched so that the bars may be driven in any desirable combination, but not all bars are driven at the same time. Switching between sequential bars must provide an overlap to accommodate the lag between the optical output of the main laser cavity and the input pulse to the diode bar. Although the diode bars operate uncooled at a low duty cycle, the YAG output is a continuous wave.

9 Claims, 7 Drawing Figures

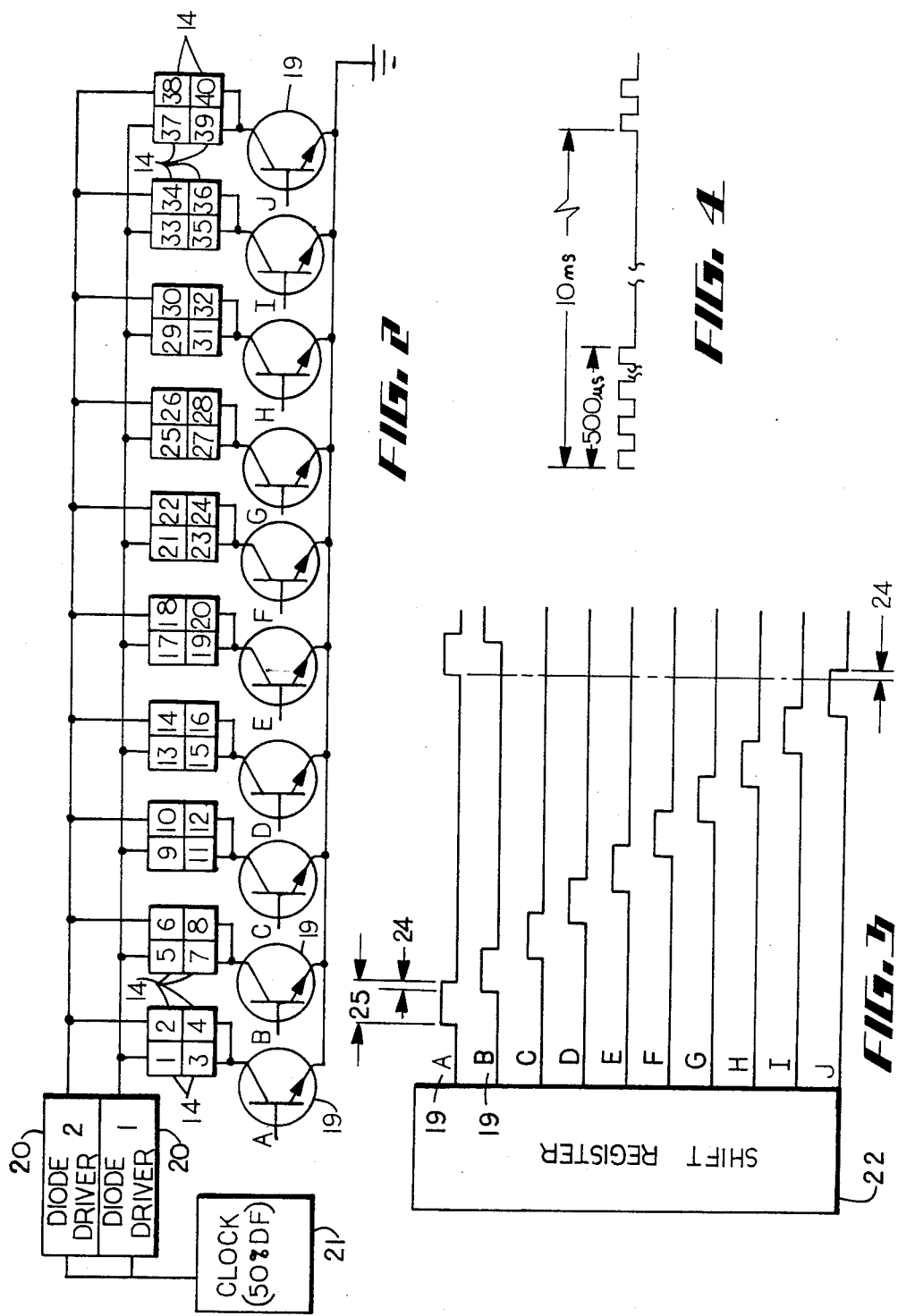

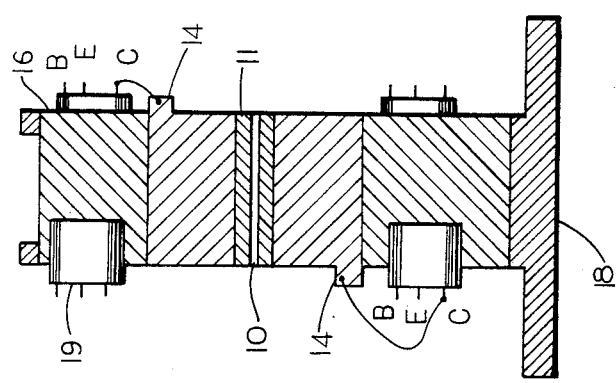
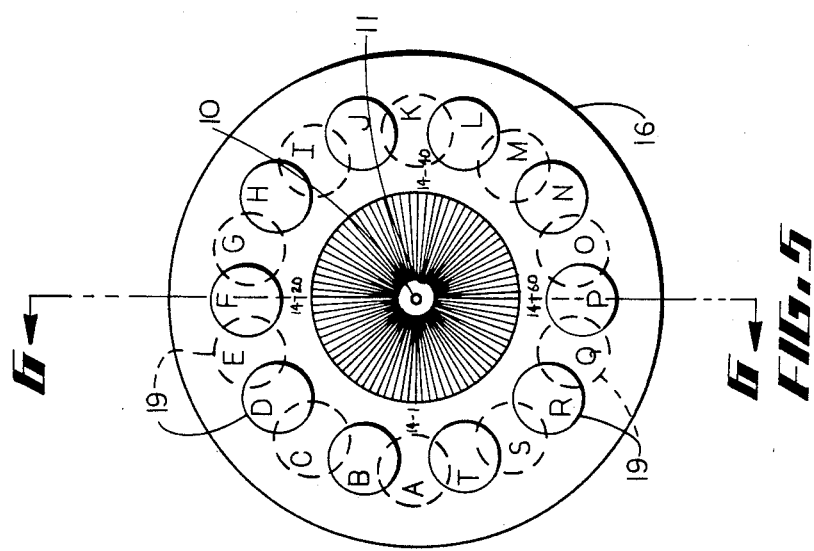

UNCOOLED YAG LASER

BACKGROUND OF THE INVENTION

The present invention relates, generally, to laser devices, and more particularly, to an improved laser device employing diode laser bars as the pumping means and a YAG rod as the gain medium.

The concept of pumping a neodymium (Nd) doped Yitrium Aluminum Garnett (YAG), commonly referred to as a Nd:YAG Laser with an array of semiconductor laser diodes is hardly new; but the use of laser diodes to pump a high energy gain medium laser has not been widely considered in the past. There have been many papers published and U.S. patents issued describing low power diode pumped lasers, e.g., U.S. Pat. No. 3,624,545, Semiconductor Pumped Laser, which teaches linear arrays of individual laser diodes. This approach can be scaled up to drive Nd:YAG Lasers at modest power levels, but the applications have been limited to those requiring continuous wave (CW) pumping, primarily because of the limitations in peak power and power density imposed by the use of single laser diodes, and in all cases it has been necessary to cool the linear arrays of individual laser diodes used to pump the laser medium. Until now, the design of diode pumps has been based on individual diode chips because the uniformity of wafers has been poor, both with respect to diode performance and output wave length. Continuous wave (CW) pumping, primarily because of the limitation in peak power and power density imposed by the use of single diodes which simply cannot be arranged physically in sufficient density around the medium to be pumped, has been the standard method of laser pumping. Of course, to run a diode laser CW required the laser to be cooled.

The laser diode bar is a bar of material cleaved from a wafer which contains many individual diode contact stripes, each of which is equivalent to a single diode. The overall improvement in diode packing density that is possible using a bar array approach is between forty and two hundred times over single diode pump arrays.

All lasers include a laser medium having a near 100% feed-back mirror at one end and a partial feed-back mirror at the opposite end so as to form a cavity. The mirrors define an optical access extending through the cavity in a direction perpendicular to both mirrors. In the case of the solid state laser, as here, the crystal rod itself may be polished so the polished surfaces reflect the beam many times before emerging. The lasing medium, in this case a YAG rod, forms the laser cavity and the atoms in the lasing medium have quantum energy levels which define allowable rotational, vibrational and electronic energy states for the atoms. In the absence of external stimulation, most of the atoms in the lasing medium subsist in the lower energy status $E_1$. As a result of random energy transfer effects, however, a small fraction of the atom population will normally be in a higher energy level $E_2$ at any given moment. A beam of photons interacts with free atoms in the ground state $E_1$ or the excited state $E_2$ in many ways. Three of these ways are of particular interest. The photon interacts with an atom in the ground state $E_1$, the atom absorbs the photon and is left in the excited state $E_2$. This process is called induced or stimulated absorption. An atom in the excited state $E_2$ can drop back or decay by either spontaneous emission or induced or stimulated emission. In spontaneous decay the radiation is emitted in all directions or is noncoherent. In induced emission, the photons induce the atoms in state $E_2$ to decay by emitting photons traveling in the same direction as the incident photon. The result is a unidirectional coherent beam. For every incident photon we have two outgoing photons and this is the reason why light amplification takes place. The basic requirement of a laser is to have predominently induced transitions so that the radiation is coherent and phase related to the incident radiation. Induced transitions are achieved by first causing population inversion, which occurs when there are more atoms in the higher energy state $E_2$ than the lower energy state $E_1$. During discharge of the laser some of the photons emitted by the first atoms to decay are emitted in a direction parallel to the optical axis of the laser cavity. Since one end of the cavity is fully mirrored and the other end is partially mirrored, these photons, on the average, undergo multiple reflections between the two mirrored surfaces before they finally pass through the partial feedback mirror at the emission end of the cavity. During the course of these multiple internal reflections within the laser cavity, these photons cause stimulated or induced emission of additional photons by emitting photons traveling in the direction of the incident photon, i.e., parallel to the optical axis of the laser. The photons emitted by induced or stimulated emission also undergo multiple reflections between the mirrored surfaces and continue the process to form the now well-known beam of highly coherent, monochromatic laser radiation.

This process of raising the atoms to an excited energy state to establish a population inversion is known in the art as pumping the laser. Many different methods and techniques are used to pump different kinds of lasers. The Nd:YAG laser in the instant case is pumped by another laser, a semiconductor or diode laser. The diode laser functions just as any other laser, as described above. Specifically, typical semiconductor lasers are made by defusing another metal into N-type gallium arsenide to form the p-n junction. While some light is emitted in directions away from the junction, some light will move along the plane of the junction and will trigger off additional light signals by the process described above as induced or stimulated emission. The important fact is that the stimulated signal will be an exact replica of the triggering signal and so will add to it. Thus the initial signal moving along the junction will be multiplied many times before reaching the end of the junction. The front and back ends of the junction function as the mirrors discussed above. Some light is reflected back and forth between the front and back ends of the junction further amplifying between each bounce, and a coherent light output emerges from the edge of the junction and produces laser action.

The diode arrays, whether linear arrays of individual diodes as in the old art or arrays of diode bars as in this invention, are generally positioned similarly around the laser rod sleeve as shown in FIGS. 5, 6, and 7. The laser diode arrays emit a fan-shaped beam approximately 30° by 60° full angle with the smaller dimension oriented parallel to the laser rod axis. The beam incident on the rod sleeve surface is focused by the inside curvature so that the pump light is concentrated near the rod axis.

The limitations in peak power and power density of single diode pump arrays, as used in the prior art, are such that the array must be driven by a continuous wave. The slope efficiency of a laser diode is usually much higher than its absolute efficiency because it is operated above threshhold; hence, much of the input power is consumed maintaining threshhold. Hence, internal quantum efficiency is greatly increased by driving the diode in a series of short pulses rather than the long pulses associated with a continuous wave. Thermal affects on diode performance are also significantly reduced by driving the diode with very high frequency pulses for short periods. Continuous wave form requires cooling of the diode, as in all prior art CW driven semi-continuously pumped arrays because heating increases or shifts the wavelength of the diode. The Nd:YAG rod has a desired absorption spectrum which needs to be matched by the pump wavelength for efficient operation. Pulsing the diodes minimizes the heating and resulting shift in diode wavelength. Furthermore, a continuously pumped semiconductor laser array has a short life.

It is an object of this invention to produce a semiconductor laser array for pumping another laser cavity which has a continuous output without cooling the semiconductor pump array and yet functions for a very long lifetime and is very small in size. Another object of this invention is to produce an improved Nd:YAG laser by maintaining the spectral match between the gain medium and the pump. It is a further object to accomplish the foregoing objectives and produce a diode pump array with a high power and high power density output specifically for pumping another high powered output laser cavity.

SUMMARY OF THE INVENTION

In summary, the laser of this invention accomplishes the above objects and overcomes the disadvantages of the prior devices by providing multiple diode bars, each bar containing many diodes mounted on a metal plate which in turn circumferentially envelope a Nd:YAG rod, or any other suitable solid state gain medium which has an absorbtion spectrum matching the wavelength of the laser diodes. The YAG rod, as in any other laser, has mirrored ends so as to provide an optical cavity with an axis generally oriented along the centerline of the YAG rod. The multiple diode bars are driven by a high frequency pulse which is switched by transistors so as to drive the diode bars in any desirable combination, but not all diode bars are driven at the same time. However, the switching between two diode bars must be done with overlap to accommodate the lag between the optical output of the main laser cavity and the input pulse to the diode bar. Further, the diode bars must be switched so that the YAG laser operates in a continuous wave mode, although any given diode in the optical pump is pulsed at a very low duty factor so that the diode pump array may run uncooled.

BRIEF DESCRIPTION OF THE DRAWINGS

FIG. 2 is one-half the electrical diagram to drive 80 diode bars and shows how the diode bars are driven and switched;

FIG. 3 is a diagram showing how switching between diode bars is timed to provide overlap between diode bars;

FIG. 4 shows the wave form of the high frequency pulse;

FIG. 5 is an enlarged view showing the physical orientation of the varous elements of the diode pump YAG laser; and FIG. 6 is an enlarged section view along the line 6—6 in FIG. 5.

DESCRIPTION OF THE PREFERRED EMBODIMENT

In the preferred embodiment of the present invention, the Nd:YAG laser is initiated and pumped by a series of diode bar laser arrays. The laser diode bars used to pump the YAG rod were fabricated from liquid phase epitaxially grown wafers which are readily available from commercial sources. All were stripe-geometry double heterostructure lasers, and all utilized dielectric highly reflective (HR) coatings on the back facets and halfwave passivation coatings on the output facets. In optimizing the wafer design, it is desirable to utilize as much of the bar facet for active emission as possible without incurring unacceptable thermal penalties or exciting internal parasitic lasing modes that degrade the laser. Generally, the heat flow away from the active region is optimum when the stripe width is small and the separation is large. It would appear that a small stripe with the highest packing density consistent with parasitic mode supression is best. The standard wafer is 1 cm by 1 cm, which makes a standard diode bar length of 1 cm. A 60 $\mu$m stripe width was used on 250 $\mu$m centers to give 40 diodes per standard diode bar length. The wafers are cleaved into a 150 $\mu$m width utilizing a laser thin film resistor trimmer. This gives a diode bar which has 40 diodes, spaced 250 $\mu$m apart with the cavity length being 150 $\mu$m, with each diode having a 60 $\mu$m stripe width. A HR coating is then applied to the back facet and a halfwave passivation coating to the front facet so you now have an optical resonator length of 150 $\mu$m with unidirectional output. The trimmed diode bars are then bonded to a copper heat sink plate on either side, and each copper plate is provided with a tab for electrical connection.

Figure 7:
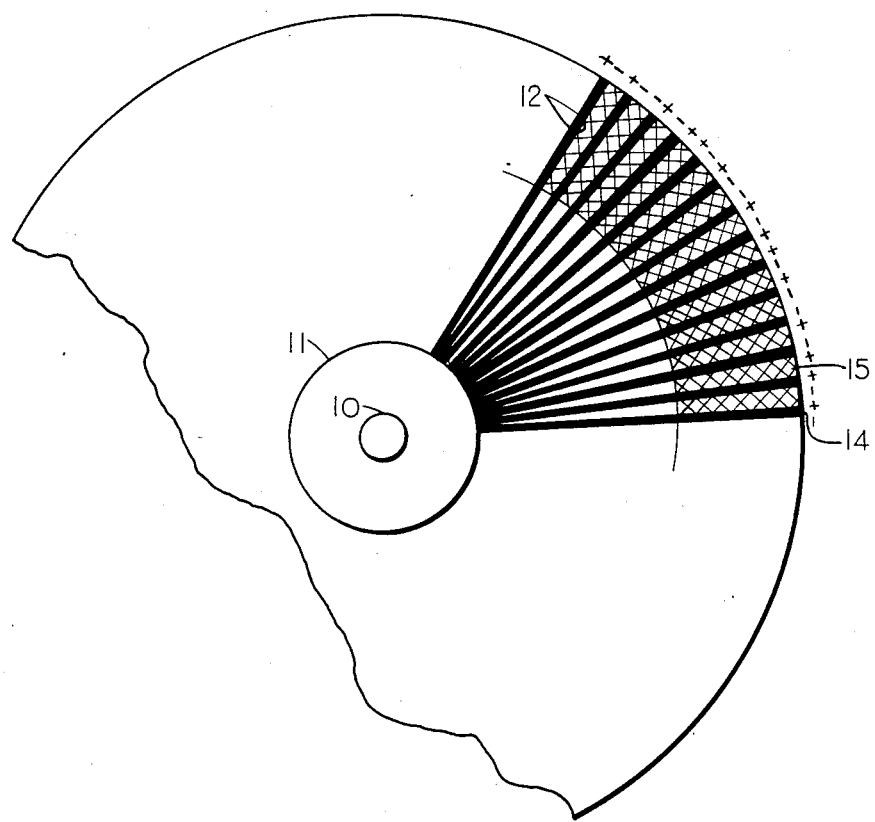
FIG. 7 is a further enlarged partial view of the center portion of FIG. 5.

The diode bar arrays are arranged circumferentially around the Nd:YAG rod generally as shown in FIGS. 5-7. The Nd:YAG rod 10 is centrally located in an undoped YAG sleeve 11 and may be bonded in place with RTV silicone rubber or any other highly transmissive material with similar optical and thermal properties which provides acceptable thermal impedence. The size of the laser rod 10 is important because the resonance absorption of the circulating power, which is associated with terminal level population, is proportional to rod length and acts to reduce the effective gain; also, the gain of the laser is inversely related to the rod's cross-sectional area for a given total metastable level population. The YAG rod actually used here was 1 mm in diameter and 1 cm in length. The sleeve 11 is in turn supported by extensions of the copper plates 12 which sandwich both sides of the diode bars to form a double sided package to complete the diode bar 14. The diode bars 14 are then stacked circumferentially around the sleeve 11 and spaced with the dielectric material 15 to form an array of diode bars. As previously indicated, the diode bar is cleaved from a wafer. In the breadboard model shown, there were 40 diodes per bar. A single diode chip, although dependent on stripe width, requires about 240 mA. Therefore, a diode bar requires this number times the number of diodes in the bar, or, as here, 40×240 mA, or about 10 A. The array of diode bars 14 and the dielectric material 15 separating the bars is contained at its outer perimeter by an aluminum tube 16. The aluminum tube 16 is shown supported in a base stand 18 simply for convenience. The aluminum tube 16 also supports one transistor switch 19 for each four diode bars.

Figure 1:
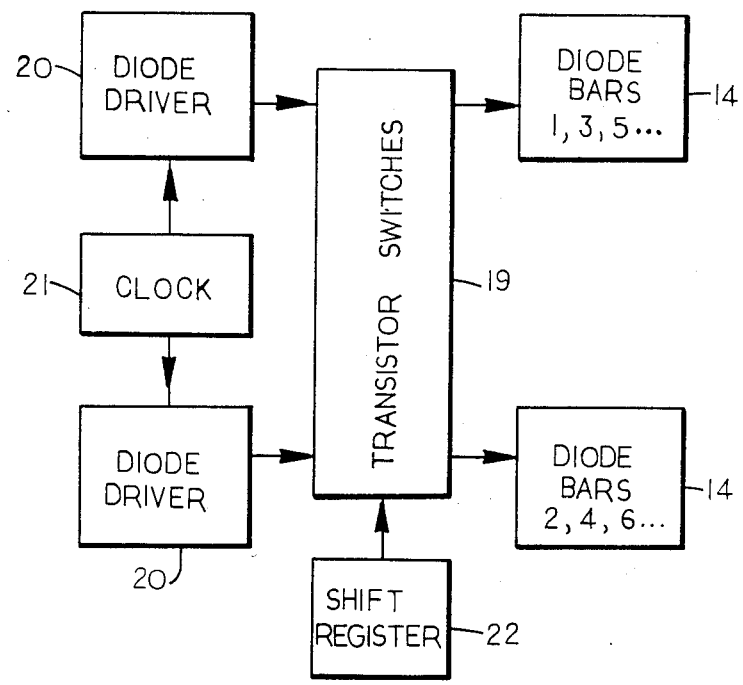
FIG. 1 is a block diagram showing how the diode bars of the semiconductor laser pump are switched and controlled.

The overall schematic, in a logic sense, is shown in FIG. 1. Two diode drivers, which may be any commercially available diode driver capable of producing peak currents slightly greater than required, are interconnected by a clock 21 so as to output a square wave with a 50% duty factor and a 100 ns pulse width (PW). The 100 ns PW output is switched by transistor switches 19 so that four diode bars 14 are driven at the same time, two diode bars by each of the diode drivers. One half of the circuit required to drive an array of 80 diode bars is shown in FIG. 2. The preferred geometric arrangement is shown in FIGS. 5–7. The 80 diode bars 14-1 thru 14-80 are shown spaced circumferentially around the YAG sleeve 10 with transistor switches 19-A thru 19-T alternating on opposite faces of the tube or frame 16. This arrangement is optimum to minimize the line length connecting the diode bars 14 to transistors 19. Diode bars 14-1 thru 14-4 are connected to transistor 19-A, while diode bars 14-5 thru 14-8 are connected to 19-B, and 14-9 thru 14-12 are connected to 19-C, etc. with alternate transistors radially staggered and located on opposite faces.

Each diode bar is pulsed for a time period of 500 μs and, since there are four diode bars driven concurrently, the total time envelope to drive the entire array of 80 diode bars would be 20 times 500 μs or 10 ms. However, in order to produce a continuous wave output in the YAG laser, it is essential to measure the lag in the optical output of the YAG laser in relationship to the input to the diode pump and then at least match this lag with a delay in turning off one diode bar after the second bar has started. In other words, as shown in FIG. 3, the delay 24 represents the time after transistor switch 'B' closes before transistor switch 'A' opens. With the breadboard actually operated, which used GaAlAs laser diodes, the delay was 30 μs. The switching of the transistor switches 19, so as to provide both the proper period of time 25 that each diode bar is pulsed with 100 ns PW square wave and the delay or overlap 24 in pulsing sequential diode bars, is provided by the shift register 22.

Terminal polarity of the various diode bars are indicated in FIG. 7. The positive terminals of diode bars 1 and 2 are wired to driver 1, while the positive terminals of diode bars 3 and 4 are wired to driver 2. The negative terminals of diode bars 1-4 are wired to the collector terminal 'C' of transistor 'A'. The base 'B' terminal of transistor 'A' is connected to the shift register and the emitter terminal 'E' of transistor 'A' is connected to ground, all as shown in the schematic of FIG. 2.

FIG. 4 simply shows the 100 ns pulsed DC with a 50% duty factor, which each diode bar sees for a period of 500 μs, and the time period it takes to pulse the entire diode bar array as 10 ms.

In summary, simply, two drivers 20, are used to insure power supply requirements and small size. A 500μ sec pulse width "on time" for each of 20 bars gives 20×500μ sec for 10 ms. Four bars are turned on at one time, e.g. 1, 3, by one driver and 2, 4 by the second driver. Eighty bars are used in total in the described array or 20 groups of four bars and one transistor is used to turn on four bars.

Of course, the wave length of the diode bars must be selected to maximize the effective absorption coefficient of the Nd:YAG rod. The spectral width of the diode array must be less than about 5 nm or serious reduction in efficiency may result. Therefore, the diode bars must be carefully matched with respect to wave length at operating temperature. Since a typical spectral width of a pump diode is about 2 to 3 nm, the diode emission wave length must be matched to a few nanometers. The emission wave length of a GaAlAs laser diodes shifts about 0.25 nm per °C. change in junction temperature, so the array temperature must therefore be controlled to roughly ±5° C. to avoid detuning effects. While temperature stabilization is a function of the overall heat sink properties of the installation, the plates 12, previously discussed as sandwiching each diode bar, are important. The duty factor of each diode bar must be matched to this overall heat sink, and it is believed that the duty factor should be between 2.5 and 5%. In the instant breadboard used here as an example, there are 20 transistor switches so any diode bar would be on 5% of the time. However, the pulsed square wave gives a 50% duty factor so any diode bar sees a resultant duty factor of 2.5%.

It should now be reasonably clear how the various elements are combined to produce a continuous wave Nd:YAG laser pumped by an array of diode bars which requires no external cooling.

Although the present invention is described and illustrated by reference to a preferred embodiment, it will be understood that various modifications, substitutions, and alterations, which may be apparent to one skilled in the art, may be made without departing from the spirit of the invention. Accordingly, the scope of the present invention is defined by the following claims.

What is claimed is:

1. A continuous wave laser device comprising:

A solid state gain medium member capable of lasing when pumped with energy and having spaced reflective end surfaces so as to form a cavity and define an optical axis extending through said cavity in a direction perpendicular to each reflective end surface, one of said reflective end surfaces having an aperture for emitting a portion of the output energy;

multiple diode bars containing a plurality of connected diode lasers, capable of being operated as lasers, located in proximity to said solid state gain medium member for pumping energy into said member to cause the member to lase and produce an optical output;

electronic high frequency pulse means, operatively connected to excite said multiple diode bars; and means to sequentially switch said multiple bars so that at least one, but not all, of said multiple diode bars are connected to said pulse means concurrently, with overlap connection between said sequentially switched diode bars of sufficient duration to accommodate the lag between the optical output of the solid state gain medium member and the high frequency pulse input to said diode bar whereby said solid state gain medium member produces a continuous wave optical output without need for cooling said diode lasers.

2. The continuous wave laser device of claim 1 wherein said solid state gain medium member is a YAG rod.

3. The continuous wave laser device of claim 2 wherein said reflective end surface having an aperture for emitting a portion of said output energy of said YAG rod is a partially reflecting mirror.

4. The continuous wave laser device of claim 2 wherein said multiple diode bars are arranged so as to circumferentially envelope said YAG laser rod and said multiple diode bars are oriented so their maximum output aligns with and is parallel to said optical axis.

5. The continuous wave laser device of claim 4 wherein said high frequency pulse means is pulsed direct current to form a high frequency square wave.

6. The continuous wave laser device of claim 2 wherein said laser diode bars are switched by said means to sequentially switch said multiple laser bars so that any given laser diode bar operates at a duty cycle between 2.5 and 5.0 percent.

7. The continuous wave laser device of claim 2 wherein said multiple diode bars are made from GaAlAs wafers containing many single diode chips connected in parallel.

8. The continuous wave laser device of claim 2 wherein said multiple diode bars are cleaved from epitaxially grown wafers having stripe-geometry with heterostructure with HR coatings on the back facets and half wave passivation coatings on the output facets.

9. The continuous wave laser device of claim 2 wherein said means to sequentially switch said multiple laser bars are transistor switches.

* * * * *